United States Patent
Pathak et al.

(10) Patent No.: US 11,556,394 B2
(45) Date of Patent: Jan. 17, 2023

(54) SYSTEM AND METHOD FOR CONTROLLING ACCESS TO SHARED RESOURCE IN SYSTEM-ON-CHIPS

(71) Applicant: NXP B.V., Eindhoven (NL)

(72) Inventors: Akshay Kumar Pathak, Noida (IN); Deepak Mahajan, Noida (IN); Arpit Gupta, Delhi (IN); Dinesh Joshi, Delhi (IN); Vivek Singh, Noida (IN)

(73) Assignee: NXP B.V., Eindhoven (NL)

( * ) Notice: Subject to any disclaimer, the term of this patent is extended or adjusted under 35 U.S.C. 154(b) by 54 days.

(21) Appl. No.: 17/302,903

(22) Filed: May 14, 2021

(65) Prior Publication Data

US 2022/0365828 A1 Nov. 17, 2022

(51) Int. Cl.
*G06F 9/46* (2006.01)
*G06F 9/52* (2006.01)
*G06F 9/50* (2006.01)

(52) U.S. Cl.
CPC .............. *G06F 9/52* (2013.01); *G06F 9/5016* (2013.01)

(58) Field of Classification Search
CPC ................................ G06F 9/52; G06F 9/5016
See application file for complete search history.

(56) References Cited

U.S. PATENT DOCUMENTS

| 6,851,056 B2 | 2/2005 | Evans et al. |
| 7,207,041 B2 | 4/2007 | Elson et al. |
| 9,959,593 B2 | 5/2018 | Aleksic et al. |

FOREIGN PATENT DOCUMENTS

| EP | 1403773 A2 | 3/2004 |
| EP | 1403773 A3 | 12/2005 |
| EP | 1675003 A2 | 6/2006 |
| EP | 1675003 A3 | 2/2010 |
| WO | 2006089560 A1 | 8/2006 |

*Primary Examiner* — Gregory A Kessler (57) ABSTRACT

An access control system controls access to a shared resource for various functional circuits. The access control system can include a comparison circuit, a processing circuit, and a selection circuit. The comparison circuit receives identification data associated with a functional circuit based on a transaction initiated by the functional circuit, and compares the identification data and reference data to generate a select signal. The processing circuit receives error data and response data outputted by the shared resource based on an execution of the transaction, and generates another response data. The selection circuit selects and outputs, based on the select signal, one of the response data outputted by the shared resource and the response data generated by the processing circuit as a transaction response that is to be provided to the functional circuit.

20 Claims, 5 Drawing Sheets

SYSTEM AND METHOD FOR CONTROLLING ACCESS TO SHARED RESOURCE IN SYSTEM-ON-CHIPS

BACKGROUND

The present disclosure relates generally to electronic circuits, and, more particularly, to a system and a method for controlling access to a shared resource in a system-on-chip (SoC).

In an SoC, various functional circuits (e.g., math accelerators, motor controllers, or the like) access a shared resource (e.g., a memory) to read stored data, and execute various functional operations associated therewith. Typically, the functional operations are of two types: safety operations that include determining whether various components of the SoC are operating in a desired manner, and general-purpose operations (i.e., non-safety operations). For executing the safety operations, the associated functional circuits require error-injected data. When two sets of functional circuits executing safety and non-safety operations, respectively, initiate transactions with the shared resource in a concurrent manner, error-injected data can be provided to the set of functional circuits executing the non-safety operations. This can lead to an operational failure of such a set of functional circuits.

To solve the aforementioned problem, the SoC includes an access control system that controls access to the shared resource by assigning one of the sets of functional circuits a higher priority as compared to the other. The access control system is thus required to communicate various handshake signals between the two sets of functional circuits. Additionally, the set of functional circuits with the lower priority is required to halt the associated access operations until the other set of functional circuits with the higher priority has accessed the shared resource. This leads to a significant programming overhead on the set of functional circuits with the lower priority. Further, a design complexity of the access control system is significantly high as the access control system needs to be designed such that the two sets of functional circuits do not access the shared resource in a concurrent manner. Therefore, there exists a need for a technical solution that solves the aforementioned problems of conventional access control systems.

SUMMARY

In an embodiment of the present disclosure, an access control system for controlling access to a shared resource for a plurality of functional circuits is disclosed. The access control system can include a comparison circuit, a processing circuit that is coupled with the shared resource, and a selection circuit that is coupled with the comparison circuit, the processing circuit, and the shared resource. The comparison circuit can be configured to receive, based on a transaction initiated by a functional circuit of the plurality of functional circuits, first identification data associated with the functional circuit. The comparison circuit can be further configured to compare the first identification data with a set of reference data to generate a select signal. The processing circuit can be configured to receive error data and first response data that can be outputted by the shared resource based on an execution of the transaction. The processing circuit can be further configured to generate second response data based on the first response data and the error data. The selection circuit can be configured to select and output, based on the select signal, one of the first and second response data as third response data. The third response data can be provided to the functional circuit as a response to the transaction.

In another embodiment of the present disclosure, a system-on-chip (SoC) is disclosed. The SoC can include a plurality of functional circuits and a shared resource. A functional circuit of the plurality of functional circuits can be configured to initiate a transaction, and the shared resource can be configured to output first response data based on an execution of the transaction. The SoC can further include an access control system that can be coupled with the shared resource and the plurality of functional circuits, and configured to control access to the shared resource for the plurality of functional circuits. The access control system can include a comparison circuit configured to receive, based on the transaction initiated by the functional circuit, first identification data associated with the functional circuit. The comparison circuit can be further configured to compare the first identification data with a set of reference data to generate a select signal. The access control system can further include a processing circuit that can be coupled with the shared resource, and configured to receive error data and the first response data, and generate second response data. The access control system can further include a selection circuit that can be coupled with the shared resource, the processing circuit, and the comparison circuit, and configured to select and output, based on the select signal, one of the first and second response data as third response data. The third response data can be provided to the functional circuit as a response to the transaction.

In yet another embodiment of the present disclosure, a method for controlling access to a shared resource for a plurality of functional circuits by an access control system is disclosed. The method can include receiving, by a comparison circuit of the access control system, based on a transaction initiated by a functional circuit of the plurality of functional circuits, first identification data associated with the functional circuit. The method can further include comparing the first identification data with a set of reference data, by the comparison circuit, to generate a select signal. Further, the method can include receiving, by a processing circuit of the access control system, error data and first response data. The first response data can be outputted by the shared resource based on an execution of the first transaction. The method can further include generating, by the processing circuit, second response data based on the first response data and the error data. Further, the method can include selecting and outputting, by a selection circuit of the access control system based on the select signal, one of the first and second response data as third response data. The third response data can be provided to the functional circuit as a response to the first transaction.

In some embodiments, the functional circuit can be further configured to generate a request based on the initiation of the transaction. The request can include an address associated with the first response data, and second identification data associated with the functional circuit.

In some embodiments, the SoC can further include a controller that can be coupled with the functional circuit, the shared resource, and the selection circuit. The controller can be configured to receive the request from the functional circuit, and provide the request to the shared resource. The shared resource can output the first response data based on the request. The controller can be further configured to receive, in response to the request from the selection circuit, the third response data to provide to the functional circuit as the response to the transaction.

In some embodiments, the controller can be further configured to generate the first identification data based on the second identification data such that the first identification data is a delayed version of the second identification data. The controller can be further coupled with the comparison circuit, and configured to provide the first identification data to the comparison circuit.

In some embodiments, the access control system can further include a delay circuit that can be configured to receive the second identification data associated with the functional circuit when the transaction is initiated. The delay circuit can be further configured to generate the first identification data such that the first identification data is the delayed version of the second identification data. The delay circuit can be further coupled with the comparison circuit, and configured to provide the first identification data to the comparison circuit.

In some embodiments, to generate the second response data, the processing circuit can be further configured to inject one or more errors associated with the error data into the first response data.

In some embodiments, the select signal can be activated when the first identification data matches one reference data of the set of reference data, and deactivated when the first identification data does not match the set of reference data.

In some embodiments, the selection circuit can select and output the first response data as the third response data when the select signal is activated, and when the select signal is deactivated, the selection circuit can select and output the second response data as the third response data.

In some embodiments, the access control system can further include an error injection circuit that can be coupled with the processing circuit, and configured to generate and provide the error data to the processing circuit.

In some embodiments, the SoC can further include a core circuit that can be coupled with the comparison circuit, and configured to generate and provide the set of reference data to the comparison circuit. The set of reference data can be indicative of a set of functional circuits of the plurality of functional circuits for which an error injection operation is to be masked.

Various embodiments of the present disclosure disclose an access control system that can control access to a shared resource for multiple functional circuits. The access control system can include a comparison circuit, a processing circuit, and a selection circuit. The comparison circuit can receive, based on a transaction initiated by a functional circuit, identification data associated with the functional circuit. Further, the comparison circuit can compare the identification data with various reference data to generate a select signal. The processing circuit can receive error data and response data that is outputted by the shared resource based on an execution of the transaction, and generate another response data. The selection circuit can select and output, based on the select signal, one of the response data outputted by the shared resource and the response data generated by the processing circuit as a transaction response that is to be provided to the functional circuit.

Thus, erroneous response data (i.e., response data including various errors associated with the error data) is exclusively provided to the functional circuit executing a safety operation. Further, the error injection operation associated with the access control system is masked for the functional circuit that executes a non-safety operation. As the access control system utilizes the identification data associated with the functional circuit for determining whether the error injection is to be masked, a need for assigning priorities to the functional circuits by the access control system is eliminated. Consequently, a need for communicating handshake signals between the functional circuits is eliminated. As a result, the shared resource can be accessed by various functional circuits in a concurrent manner. Hence, a design complexity of the access control system of the present disclosure is significantly less than that of a conventional access control system that is required to arbitrate between multiple functional circuits by assigning priorities. Further, a programming overhead on various functional circuits of the present disclosure is significantly less than that on functional circuits whose access to a shared resource is controlled by the conventional access control system.

1.
2.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
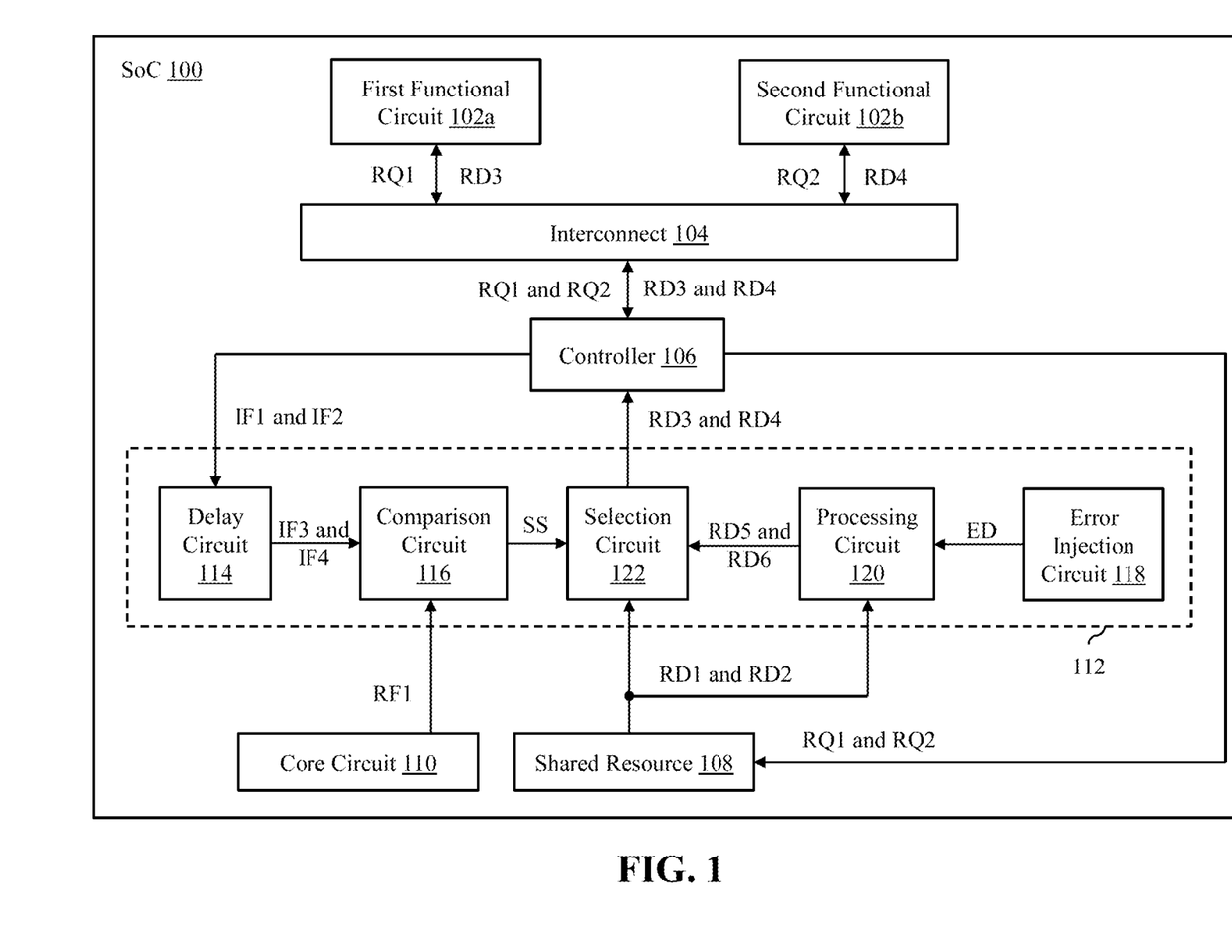
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 can include a plurality of functional circuits of which first and second functional circuits 102a and 102b are shown. Examples of the plurality of functional circuits can include, but are not limited to, a math accelerator, a motor controller, or the like. The SoC 100 can further include an interconnect 104, a controller 106, a shared resource 108, a core circuit 110, and a first access control system 112. The SoC 100 can be utilized in various consumer electronic devices (e.g., mobile phones, digital cameras, and media players), various automotive devices, various data processing devices, various networking devices, or the like.

The first and second functional circuits 102a and 102b can include suitable circuitry that can be configured to perform one or more operations. For example, the first and second functional circuits 102a and 102b can be configured to initiate various transactions (e.g., first and second transactions, respectively) with the shared resource 108. For the sake of ongoing discussion, it is assumed that the shared resource 108 is a memory. In such a scenario, the first and second transactions correspond to read transactions for reading first and second response data RD1 and RD2 stored in the shared resource 108. In an embodiment, the first and second transactions are initiated sequentially.

The first and second functional circuits 102a and 102b can be configured to generate first and second requests RQ1 and RQ2 based on the initiation of the first and second transactions, respectively. The first and second requests RQ1 and RQ2 can include first and second identification data IF1 and IF2 associated with the first and second functional circuits 102a and 102b, respectively. When a communication protocol associated with the SoC 100 corresponds to an advanced high-performance bus (AHB) protocol, the first and second identification data IF1 and IF2 correspond to master identifiers associated with the first and second functional circuits 102a and 102b, respectively. When the communication protocol associated with the SoC 100 corresponds to an advanced extensible interface (AXI) protocol, the first and second identification data IF1 and IF2 correspond to ARUSER signals associated with the first and second functional circuits 102a and 102b, respectively.

The first and second requests RQ1 and RQ2 can further include first and second addresses (not shown) associated with the first and second response data RD1 and RD2, respectively. The first and second addresses correspond to physical addresses of the shared resource 108 where the first and second response data RD1 and RD2 are stored (i.e., where the first and second transactions are to be executed), respectively. Further, the first and second functional circuits 102a and 102b can be coupled with the interconnect 104. The first and second functional circuits 102a and 102b can be configured to provide the first and second requests RQ1 and RQ2 to the interconnect 104, respectively. In an embodiment, the first and second functional circuits 102a and 102b provide the first and second requests RQ1 and RQ2 to the interconnect 104 in a sequential manner.

In response to the first and second requests RQ1 and RQ2, the first and second functional circuits 102a and 102b can be further configured to receive third and fourth response data RD3 and RD4, respectively. Based on the third and fourth response data RD3 and RD4, the first and second functional circuits 102a and 102b can be further configured to execute first and second functional operations associated therewith, respectively. In the presently preferred embodiment, the first functional operation corresponds to a safety operation and the second functional operation corresponds to a general-purpose operation (i.e., a non-safety operation). The safety operation can include determining whether various components of the SoC 100 (such as the controller 106, the first access control system 112, the shared resource 108, or the like) are operating in a desired manner. As the first functional circuit 102a executes the safety operation, the third response data RD3 can correspond to error-injected data (i.e., the first response data RD1 with various errors injected therein). The error injection operation can be executed by the first access control system 112. The first functional circuit 102a can further receive a status signal (not shown) that indicates a type of error (e.g., a single-bit or multi-bit error) detected by the controller 106 for the first transaction. The first functional circuit 102a can further execute the safety operation based on the status signal. Further, as the second functional circuit 102b executes the non-safety operation, response data utilized by the second functional circuit 102b is critical. Hence, the fourth response data RD4 is the same as the second response data RD2 that is read from the shared resource 108. In such a scenario, the error injection operation associated with the first access control system 112 is masked.

It will be apparent to a person skilled in the art that the SoC 100 is shown to include two functional circuits (i.e., the first and second functional circuits 102a and 102b) to make the illustrations concise and clear and should not be considered as a limitation of the present disclosure. In various other embodiments, the SoC 100 may include more than two functional circuits, without deviating from the scope of the present disclosure. In such a scenario, each additional functional circuit may execute one of safety and non-safety operations. Further, various functional circuits executing the safety and non-safety operations can initiate associated transactions in a concurrent manner.

The interconnect 104 can be coupled with the first and second functional circuits 102a and 102b and the controller 106. The interconnect 104 can include suitable circuitry that can be configured to perform one or more operations. For example, the interconnect 104 can be configured to receive the first and second requests RQ1 and RQ2 from the first and second functional circuits 102a and 102b in a sequential manner, respectively. The interconnect 104 can be further configured to sequentially provide the first and second requests RQ1 and RQ2 to the controller 106.

The interconnect 104 can be further configured to receive the third and fourth response data RD3 and RD4 from the controller 106 based on the execution of the first and second transactions, respectively. The third and fourth response data RD3 and RD4 are received sequentially. Further, the interconnect 104 can be configured to provide the third and fourth response data RD3 and RD4 to the first and second functional circuits 102a and 102b in a sequential manner, respectively. For the first transaction, the interconnect 104 can further receive the status signal from the controller 106, and provide the status signal to the first functional circuit 102a.

The controller 106 can be coupled with the interconnect 104, the shared resource 108, and the first access control system 112. Further, the controller 106 can be coupled with the first and second functional circuits 102a and 102b by way of the interconnect 104. The controller 106 can include suitable circuitry that can be configured to perform one or more operations. For example, the controller 106 can be configured to receive the first and second requests RQ1 and RQ2 from the first and second functional circuits 102a and 102b in a sequential manner, respectively. When the first request RQ1 is received, the controller 106 can be further configured to provide the first request RQ1 to the shared resource 108 for executing the first transaction. It will be apparent to a person skilled in the art that the controller 106 may additionally generate and provide various memory signals (e.g., a chip-select signal) to the shared resource 108 for executing the first transaction. Further, the controller 106 can be configured to provide the first identification data IF1 included in the first request RQ1 to the first access control system 112. The controller 106 can be further configured to receive, in response to the first request RQ1 from the first access control system 112, the third response data RD3. The third response data RD3 corresponds to the error-injected data. Based on the first request RQ1, the controller 106 can be configured to detect the type of error injected in the third response data RD3, and output the status signal indicative of the detected type of error. The controller 106 can be configured to provide the third response data RD3 and the status signal to the interconnect 104 to provide to the first functional circuit 102a.

When the second request RQ2 is received, the controller 106 can be further configured to provide the second request RQ2 to the shared resource 108 for executing the second transaction. It will be apparent to a person skilled in the art that the controller 106 may additionally generate and provide various memory signals to the shared resource 108 for executing the second transaction. Further, the controller 106 can be configured to provide the second identification data IF2 to the first access control system 112. In response to the second request RQ2, the controller 106 can be further configured to receive the fourth response data RD4 from the first access control system 112. Further, the controller 106 can be configured to provide the fourth response data RD4 to the interconnect 104 to provide to the second functional circuit 102b.

The shared resource 108 can be coupled with the controller 106 and the first access control system 112. The shared resource 108 can include suitable circuitry that can be configured to perform one or more operations. For example, the shared resource 108 can be configured to store various response data (such as the first and second response data RD1 and RD2). The shared resource 108 can be further configured to receive the first and second requests RQ1 and RQ2 from the controller 106. The first and second requests RQ1 and RQ2 are received sequentially. Based on the first and second requests RQ1 and RQ2, the shared resource 108 can be configured to output the first and second response data RD1 and RD2, respectively. The first and second response data RD1 and RD2 correspond to response data stored at the first and second addresses, respectively. The first and second transactions are thus executed on the shared resource 108, and the shared resource 108 outputs the first and second response data RD1 and RD2 based on the execution of the first and second transactions, respectively. The shared resource 108 can be further configured to provide the first and second response data RD1 and RD2 to the first access control system 112 in a sequential manner.

Although the shared resource 108 corresponds to a memory in the presently preferred embodiment of the present disclosure, it will be apparent to a person skilled in the art that the scope of the present disclosure is not limited to it. In various other embodiments, the shared resource 108 may correspond to various other components of the SoC 100 (such as a third functional circuit (not shown)), without deviating from the scope of the present disclosure.

The core circuit 110 can be coupled with the first access control system 112. The core circuit 110 can include suitable circuitry that can be configured to perform one or more operations. For example, the core circuit 110 can be configured to generate a set of reference data (not shown). The set of reference data can be indicative of various functional circuits of the plurality of functional circuits that execute general-purpose operations, and hence, require the error injection operation to be masked. In other words, for such functional circuits, various errors are not injected in associated response data read from the shared resource 108 as the response data read from the shared resource 108 is critical data. As the second functional circuit 102b executes the non-safety operation and requires the error injection to be masked, the set of reference data includes first reference data RF1 that is indicative of the second functional circuit 102b. It will be apparent to a person skilled in the art that when the SoC 100 includes more than two functional circuits (i.e., the first and second functional circuits 102a and 102b), the set of reference data may include additional reference data indicative of additional functional circuits that execute non-safety operations.

The first access control system 112 can be coupled with the shared resource 108. Further, the first access control system 112 can be coupled with the first and second functional circuits 102a and 102b by way of the controller 106 and the interconnect 104. The first access control system 112 can be configured to control access to the shared resource 108 for the first and second functional circuits 102a and 102b. The first access control system 112 can include a delay circuit 114, a comparison circuit 116, an error injection circuit 118, a processing circuit 120, and a selection circuit 122.

The delay circuit 114 can be coupled with the controller 106 and the comparison circuit 116. The delay circuit 114 can include suitable circuitry that can be configured to perform one or more operations. For example, the delay circuit 114 can be configured to receive the first and second identification data IF1 and IF2 from the controller 106. The delay circuit 114 receives the first and second identification data IF1 and IF2 when the first and second transactions are initiated, respectively. Further, the delay circuit 114 can be configured to generate third and fourth identification data IF3 and IF4 such that the third and fourth identification data IF3 and IF4 are delayed versions of the first and second identification data IF1 and IF2, respectively. The delay circuit 114 can be further configured to provide the third and fourth identification data IF3 and IF4 to the comparison circuit 116. In an example, a delay associated with the delay circuit 114 is equal to a time duration of an address phase of the first and second transactions (i.e., one cycle of a clock signal (not shown) associated with the SoC 100). In other words, for the first transaction, the third identification data IF3 is provided to the comparison circuit 116 at the same time as the first transaction is executed with the shared resource 108 and the shared resource 108 outputs the first response data RD1. Similarly, for the second transaction, the fourth identification data IF4 is provided to the comparison circuit 116 at the same time as the second transaction is executed with the shared resource 108 and the shared resource 108 outputs the second response data RD2.

The comparison circuit 116 can be coupled with the core circuit 110, the delay circuit 114, and the selection circuit 122. The comparison circuit 116 can include suitable circuitry that can be configured to perform one or more operations. For example, the comparison circuit 116 can be configured to receive the set of reference data (i.e., the first reference data RF1) from the core circuit 110. The comparison circuit 116 can be further configured to receive the third and fourth identification data IF3 and IF4 from the delay circuit 114 based on the first and second transactions initiated by the first and second functional circuits 102a and 102b, respectively. Thus, the comparison circuit 116 receives the third and fourth identification data IF3 and IF4 in a sequential manner.

The comparison circuit 116 can be further configured to compare each of the third and fourth identification data IF3 and IF4 with the first reference data RF1 to generate a select signal SS. As the first reference data RF1 is indicative of the second functional circuit 102b and the third identification data IF3 is the delayed version of the first identification data IF1, the third identification data IF3 and the first reference data RF1 do not match. In such a scenario, the comparison circuit 116 deactivates the select signal SS (i.e., generates the select signal SS at a logic low state). On the other hand, as the fourth identification data IF4 is the delayed version of the second identification data IF2, the fourth identification data IF4 and the first reference data RF1 match. In such a scenario, the comparison circuit 116 activates the select signal SS (i.e., generates the select signal SS at a logic high state). Thus, the select signal SS is activated when the received identification data matches the first reference data RF1. Similarly, the select signal SS is deactivated when the received identification data does not match the first reference data RF1. The comparison circuit 116 can be further configured to provide the select signal SS to the selection circuit 122.

It will be apparent to a person skilled in the art that when the set of reference data includes more than one reference data, the comparison circuit 116 can be configured to compare each received identification data with each reference data of the set of reference data. In such a scenario, the select signal SS is activated when the received identification data matches one reference data of the set of reference data, and deactivated when the received identification data does not match any reference data of the set of reference data.

The error injection circuit 118 can include suitable circuitry that can be configured to perform one or more operations. For example, the error injection circuit 118 can be configured to generate error data ED. The error injection circuit 118 generates the error data ED based on control data (not shown). The control data can be generated by a functional circuit of the plurality of functional circuits that executes the safety operation (e.g., the first functional circuit 102a) or the core circuit 110. The error injection circuit 118 receives the control data when the functional circuit of the plurality of functional circuits that executes the safety operation initiates a transaction (i.e., when the first transaction is initiated by the first functional circuit 102a).

The processing circuit 120 can be coupled with the shared resource 108, the error injection circuit 118, and the selection circuit 122. The processing circuit 120 can include suitable circuitry that can be configured to perform one or more operations. For example, the processing circuit 120 can be configured to receive the first and second response data RD1 and RD2 associated with the execution of the first and second transactions from the shared resource 108, respectively. In other words, the first and second response data RD1 and RD2 are received in a sequential manner. The processing circuit 120 can be further configured to receive the error data ED from the error injection circuit 118. Based on the first response data RD1 and the error data ED, the processing circuit 120 can be configured to generate fifth response data RD5. Similarly, based on the second response data RD2 and the error data ED, the processing circuit 120 can be configured to generate sixth response data RD6. To generate the fifth and sixth response data RD5 and RD6, the processing circuit 120 can be further configured to inject one or more errors associated with the error data ED into the first and second response data RD1 and RD2, respectively. The processing circuit 120 can be further configured to provide the fifth and sixth response data RD5 and RD6 to the selection circuit 122 in a sequential manner.

The selection circuit 122 can be coupled with the shared resource 108, the comparison circuit 116, the processing circuit 120, and the controller 106. The selection circuit 122 can be configured to receive the select signal SS from the comparison circuit 116. Further, the selection circuit 122 can be configured to receive various response data from the processing circuit 120 (i.e., the fifth and sixth response data RD5 and RD6) and various response data from the shared resource 108 (i.e., the first and second response data RD1 and RD2). Based on the select signal SS, the selection circuit 122 can be configured to select and output one of the response data received from the processing circuit 120 and the response data received from the shared resource 108 for providing to the controller 106. In an embodiment, when the select signal SS is deactivated, the selection circuit 122 selects and outputs the response data received from the processing circuit 120 for providing to the controller 106. Further, when the select signal SS is activated, the selection circuit 122 selects and outputs the response data received from the shared resource 108 for providing to the controller 106. In an embodiment, the selection circuit 122 includes a set of multiplexers (not shown).

When the first transaction is executed, the selection circuit 122 receives the first response data RD1 and the fifth response data RD5 from the shared resource 108 and the processing circuit 120, respectively. Further, the select signal SS received by the selection circuit 122 from the comparison circuit 116 at such a time instance is generated based on the comparison of the third identification data IF3 and the first reference data RF1. The delaying of the first identification data IF1 thus ensures that the select signal SS is associated with the first transaction. As a result, erroneous transaction execution is avoided. The selection circuit 122 can be further configured to select and output, one of the first response data RD1 and the fifth response data RD5 as the third response data RD3 based on the select signal SS. As the select signal SS is generated based on the comparison of the third identification data IF3 and the first reference data RF1, the select signal SS is deactivated. Hence, the selection circuit 122 selects and outputs the fifth response data RD5 as the third response data RD3. The selection circuit 122 can be further configured to provide the third response data RD3 to the controller 106 in response to the first request RQ1. The third response data RD3 is then provided to the first functional circuit 102a as a response to the first transaction.

When the second transaction is executed, the selection circuit 122 receives the second response data RD2 and the sixth response data RD6 from the shared resource 108 and the processing circuit 120, respectively. Further, the select signal SS received by the selection circuit 122 from the comparison circuit 116 at such a time instance is generated based on the comparison of the fourth identification data IF4 and the first reference data RF1. The selection circuit 122 can be further configured to select and output, one of the second response data RD2 and the sixth response data RD6 as the fourth response data RD4 based on the select signal SS. As the select signal SS is generated based on the comparison of the fourth identification data IF4 and the first reference data RF1, the select signal SS is activated. As a result, the selection circuit 122 selects and outputs the second response data RD2 as the fourth response data RD4. The selection circuit 122 can be further configured to provide the fourth response data RD4 to the controller 106 in response to the second request RQ2. The fourth response data RD4 is then provided to the second functional circuit 102b as a response to the second transaction.

Figure 2:
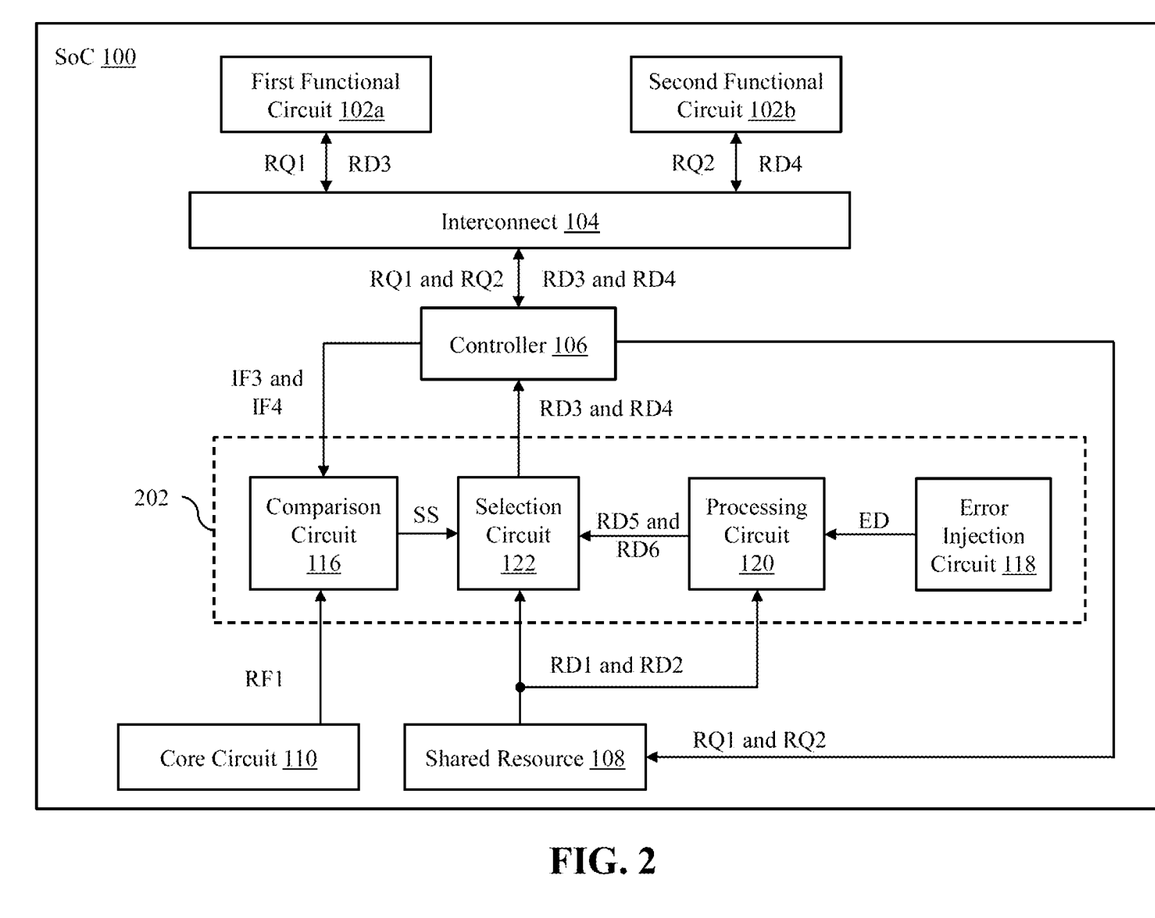
FIG. 2 illustrates a schematic block diagram of the SoC in accordance with another embodiment of the present disclosure.

FIG. 2 illustrates a schematic block diagram of the SoC 100 in accordance with another embodiment of the present disclosure. The SoC 100 can include the plurality of functional circuits of which the first and second functional circuits 102a and 102b are shown. The SoC 100 can further include the interconnect 104, the controller 106, the shared resource 108, the core circuit 110, and a second access control system 202. The second access control system 202 can include the comparison circuit 116, the error injection circuit 118, the processing circuit 120, and the selection circuit 122.

The functionalities of the first and second functional circuits 102a and 102b, the interconnect 104, the shared resource 108, and the core circuit 110 remain the same as described in FIG. 1. The difference between the SoC 100 of FIG. 1 and the SoC 100 of FIG. 2 is that the functionality of the delay circuit 114 of FIG. 1 is combined with the controller 106 in the SoC 100 of FIG. 2. As a result, when the first and second requests RQ1 and RQ2 are received by the controller 106 of FIG. 2, the controller 106 can be configured to generate and provide the third and fourth identification data IF3 and IF4 to the comparison circuit 116, respectively, as opposed to the first and second identification data IF1 and IF2 that are provided by the controller 106 of FIG. 1. Further, the functionalities of the comparison circuit 116, the error injection circuit 118, the processing circuit 120, and the selection circuit 122 remain the same as described in FIG. 1.

Figure 3A:
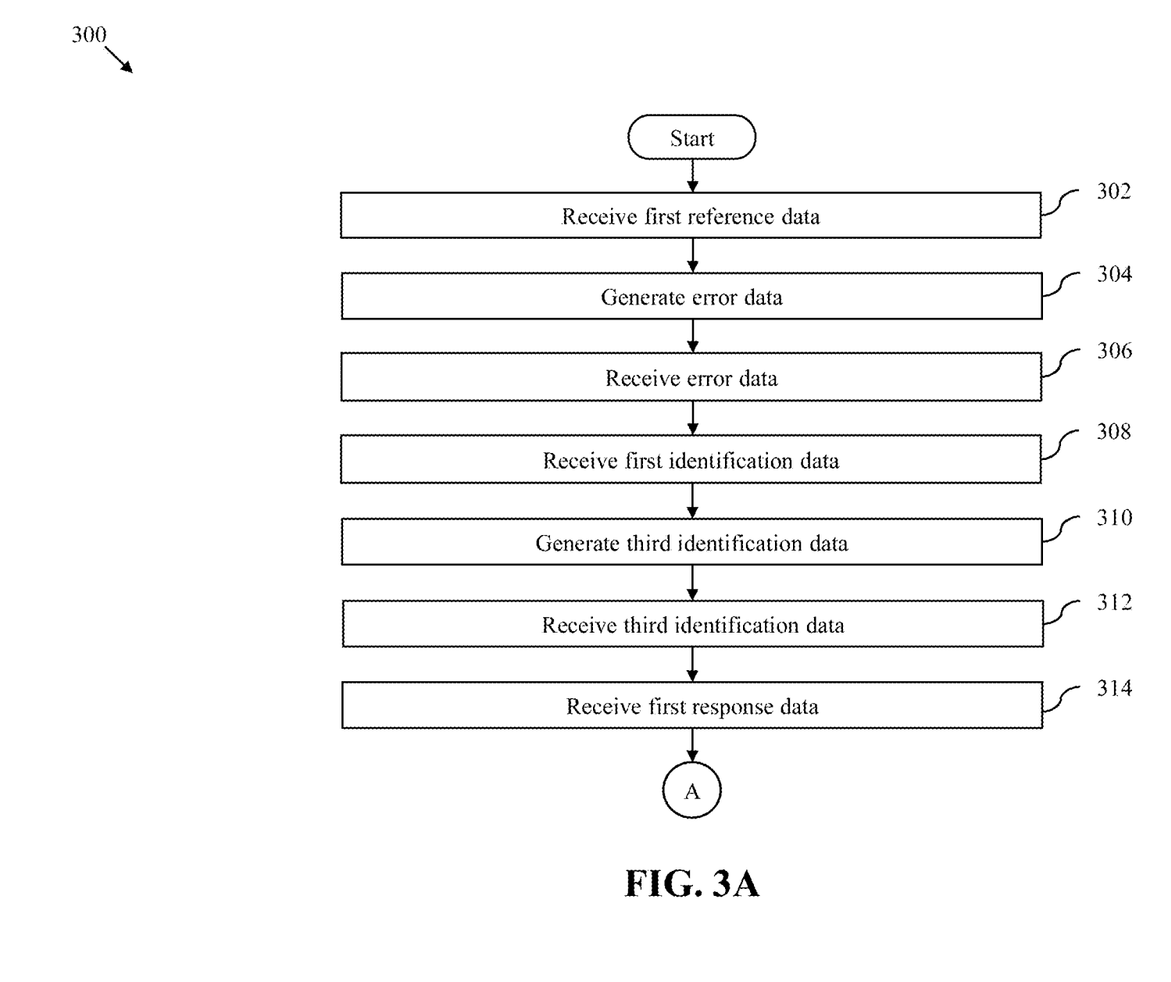
FIGS. 3A-3C, collectively, represent a flow chart that illustrates a method for controlling access to a shared resource of the SoC of FIG. 1 in accordance with an embodiment of the present disclosure.
Figure 3B:
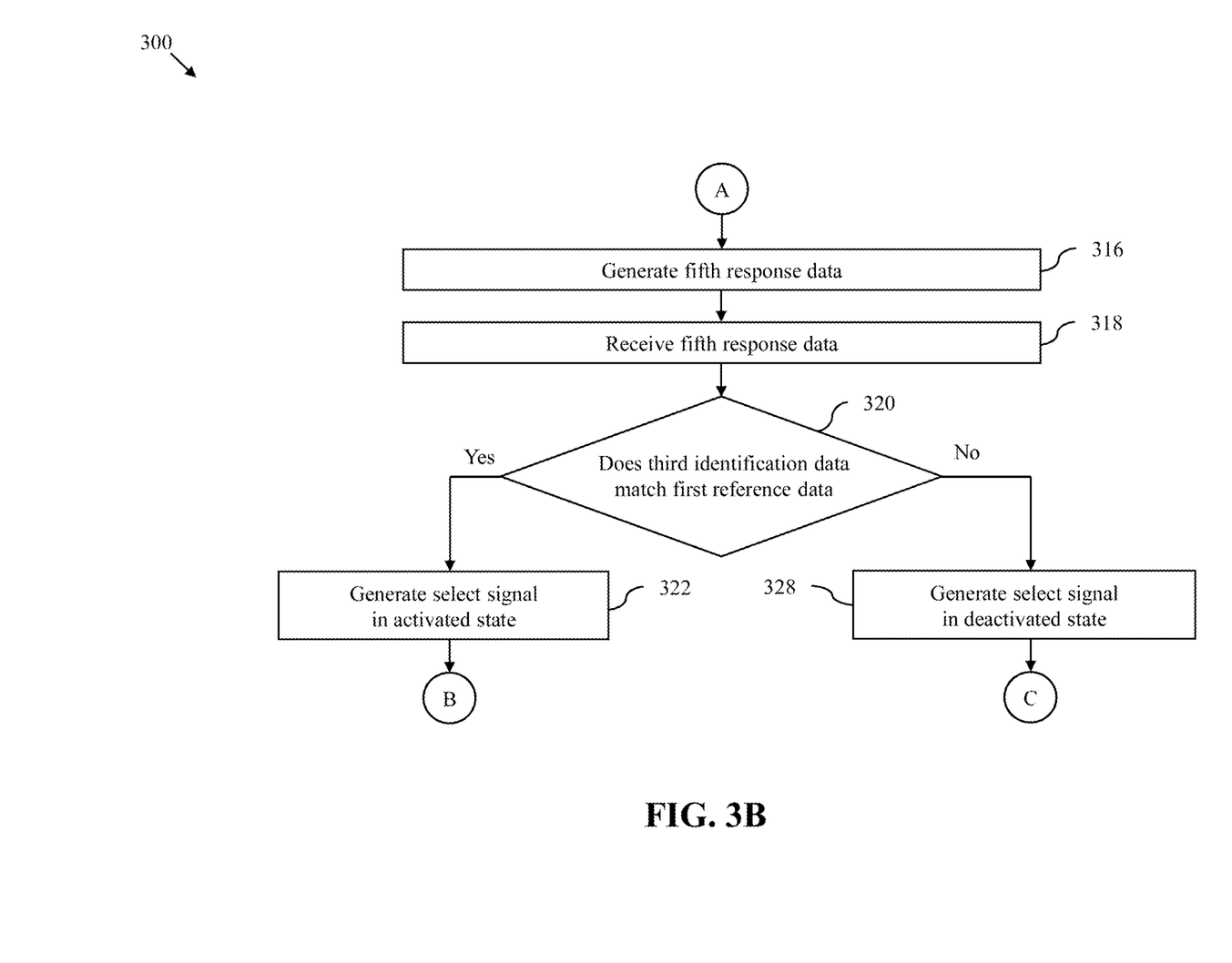
Figure 3C:
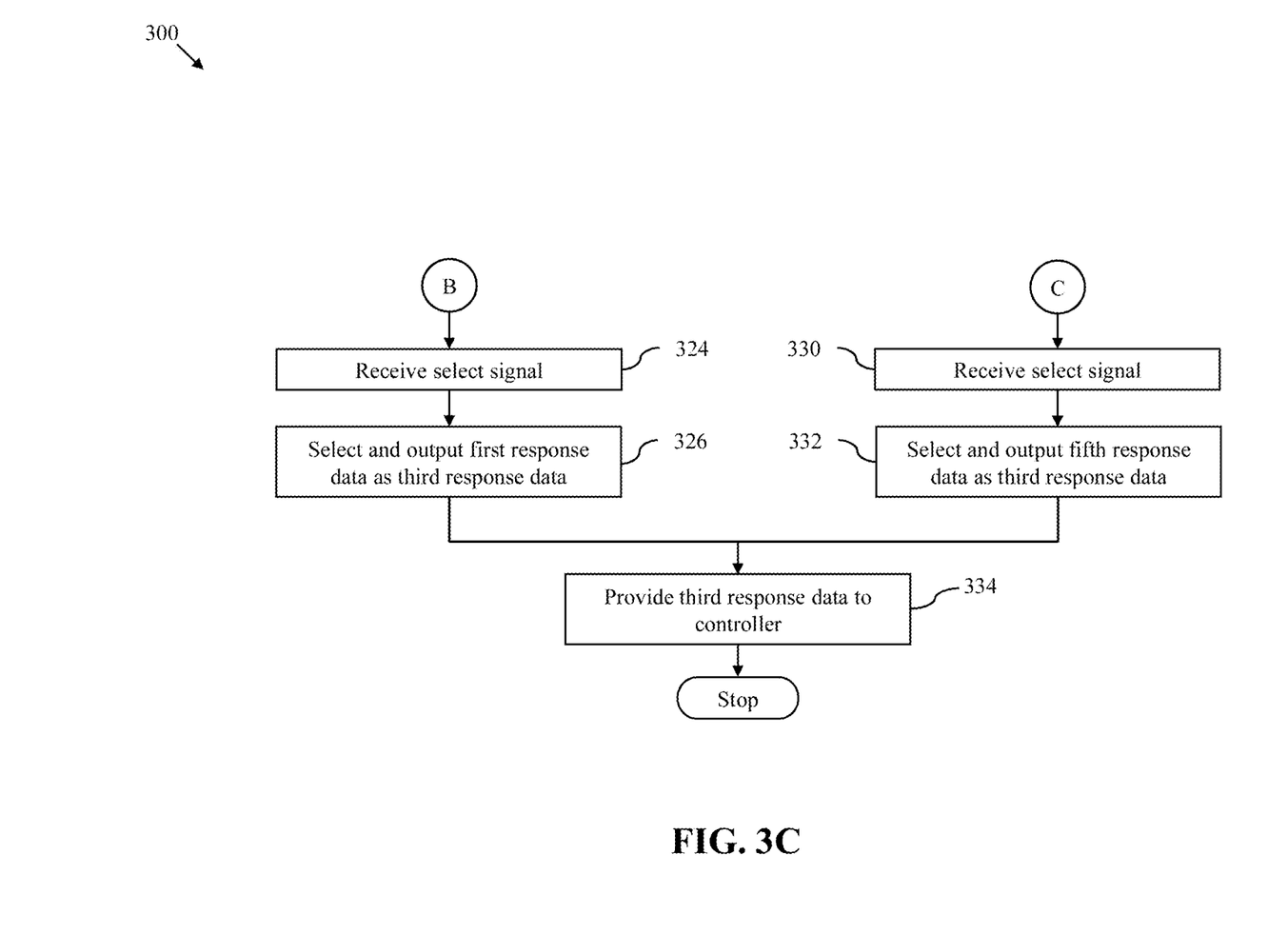

FIGS. 3A-3C, collectively, represent a flow chart 300 that illustrates a method for controlling access to the shared resource 108 in accordance with an embodiment of the present disclosure. The first and second functional circuits 102a and 102b can initiate the first and second transactions with the shared resource 108, and generate the first and second requests RQ1 and RQ2 based on the initiation of the first and second transactions, respectively. The first and second requests RQ1 and RQ2 can be generated sequentially, and provided to the controller 106, by way of the interconnect 104, in a sequential manner. The controller 106 can then provide the first request RQ1 to the shared resource 108 for executing the first transaction. The controller 106 can similarly provide the first identification data IF1 associated with the first functional circuit 102a to the delay circuit 114.

Referring now to FIG. 3A, at step 302, the comparison circuit 116 can receive the first reference data RF1 from the core circuit 110. At step 304, the error injection circuit 118 can generate the error data ED based on the initiation of the first transaction (i.e., the control data). At step 306, the processing circuit 120 can receive the error data ED from the error injection circuit 118.

At step 308, the delay circuit 114 can receive, from the controller 106 when the first transaction is initiated, the first identification data IF1 associated with the first functional circuit 102a. At step 310, the delay circuit 114 can generate the third identification data IF3 such that the third identification data IF3 is the delayed version of the first identification data IF1. At step 312, the comparison circuit 116 can receive the third identification data IF3 from the delay circuit 114. The delay circuit 114 ensures that the comparison circuit 116 receives the third identification data IF3 when the shared resource 108 executes the first transaction and outputs the first response data RD1. Thus, at step 314, the selection circuit 122 and the processing circuit 120 can receive the first response data RD1 from the shared resource 108.

Referring now to FIG. 3B, at step 316, the processing circuit 120 can generate the fifth response data RD5 based on the first response data RD1 and the error data ED. At step 318, the selection circuit 122 can receive the fifth response data RD5 from the processing circuit 120. At step 320, the comparison circuit 116 can determine whether the third identification data IF3 matches the first reference data RF1. If at step 320, the comparison circuit 116 determines that the third identification data IF3 matches the first reference data RF1, step 322 is executed. At step 322, the comparison circuit 116 can generate the select signal SS in an activated state.

Referring now to FIG. 3C, at step 324, the selection circuit 122 can receive the select signal SS from the comparison circuit 116. At step 326, the selection circuit 122 can select and output the first response data RD1 as the third response data RD3.

Referring back to FIG. 3B, if at step 320, the comparison circuit 116 determines that the third identification data IF3 does not match the first reference data RF1, step 328 is executed. At step 328, the comparison circuit 116 can generate the select signal SS in a deactivated state.

Referring back to FIG. 3C, at step 330, the selection circuit 122 can receive the select signal SS from the comparison circuit 116. At step 332, the selection circuit 122 can select and output the fifth response data RD5 as the third response data RD3. As the first reference data RF1 is indicative of the second functional circuit 102b and the third identification data IF3 is the delayed version of the first identification data IF1, the third identification data IF3 and the first reference data RF1 do not match. Hence, the comparison circuit 116 deactivates the select signal SS, and the selection circuit 122 selects and outputs the fifth response data RD5 as the third response data RD3. At step 334, the selection circuit 122 can provide the third response data RD3 to the controller 106 in response to the first request RQ1.

It will be apparent to a person skilled in the art that when the delay circuit 114 of the first access control system 112 receives the second identification data IF2 associated with second functional circuit 102b, steps 308-334 can be repeated, and the fourth response data RD4 can be outputted and provided to the controller 106 in a manner similar to that of the third response data RD3. In such a scenario, the fourth response data RD4 can be received by the controller 106 after the third response data RD3 is received. The controller 106 can then sequentially provide, by way of the interconnect 104, the third and fourth response data RD3 and RD4 to the first and second functional circuits 102a and 102b as responses to the first and second requests RQ1 and RQ2, respectively. The controller 106 can further generate the status signal based on the third response data RD3 and the first request RQ1, and provide the status signal to the first functional circuit 102a by way of the interconnect 104. The first functional circuit 102a can then execute the first functional operation associated therewith based on the third response data RD3 and the status signal. Similarly, the second functional circuit 102b can then execute the second functional operation associated therewith based on the fourth response data RD4.

The flow chart 300 illustrates the method for controlling access to the shared resource 108 in the SoC 100 of FIG. 1. It will be apparent to a person skilled in the art that a method for controlling access to the shared resource 108 in the SoC 100 of FIG. 2 can be similar to that illustrated in flow chart 300 with the absence of steps 308 and 310.

Thus, erroneous response data (i.e., the fifth response data RD5) is exclusively provided to the functional circuit executing the safety operation (i.e., the first functional circuit 102a). Further, the error injection operation associated with an access control system (i.e., the first and second access control systems 112 and 202) is masked for the functional circuit that executes a non-safety operation (i.e., the second functional circuit 102b). The access control system utilizes identification data associated with the functional circuits (i.e., the third and fourth identification data IF3 and IF4 associated with the first and second functional circuits 102a and 102b, respectively) for determining whether the error injection is to be masked. As a result, a need for assigning priorities to the plurality of functional circuits by the access control system is eliminated, thereby eliminating a need for communicating handshake signals between the plurality of functional circuits. Consequently, the shared resource 108 can be accessed by the plurality of functional circuits in a concurrent manner. In other words, the functional circuits executing safety operations are not required to halt access operations associated with the shared resource 108 until the functional circuits executing the non-safety operations have accessed the shared resource 108, and vice versa. Hence, a design complexity of the access control system of the present disclosure is significantly less than that of a conventional access control system that is required to arbitrate between multiple functional circuits by assigning priorities. Further, a programming overhead on the plurality of functional circuits of the present disclosure is significantly less than that on functional circuits whose access to a shared resource is controlled by the conventional access control system. Thus, the access control system of the present disclosure controls the access to the shared resource more efficiently than the conventional access control system.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An access control system for controlling access to a shared resource for a plurality of functional circuits, the access control system comprising:
   a comparison circuit configured to receive, based on a transaction initiated by a functional circuit of the plurality of functional circuits, first identification data associated with the functional circuit, and compare the first identification data with a set of reference data to generate a select signal;
   a processing circuit that is coupled with the shared resource, and configured to receive error data and first response data that is outputted by the shared resource based on an execution of the transaction, and generate second response data; and
   a selection circuit that is coupled with the shared resource, the processing circuit, and the comparison circuit, and configured to select and output, based on the select signal, one of the first and second response data as third response data, wherein the third response data is provided to the functional circuit as a response to the transaction.

2. The access control system of claim 1, further comprising a delay circuit configured to receive second identification data associated with the functional circuit when the transaction is initiated, and generate the first identification data such that the first identification data is a delayed version of the second identification data, wherein the delay circuit is further coupled with the comparison circuit, and configured to provide the first identification data to the comparison circuit.

3. The access control system of claim 1, wherein to generate the second response data, the processing circuit is further configured to inject one or more errors associated with the error data into the first response data.

4. The access control system of claim 1, wherein the select signal is activated when the first identification data matches one reference data of the set of reference data, and deactivated when the first identification data does not match the set of reference data.

5. The access control system of claim 4, wherein the selection circuit selects and outputs the first response data as the third response data when the select signal is activated, and when the select signal is deactivated, the selection circuit selects and outputs the second response data as the third response data.

6. The access control system of claim 1, further comprising an error injection circuit that is coupled with the processing circuit, and configured to generate and provide the error data to the processing circuit.

7. A system-on-chip (SoC), comprising:
   a plurality of functional circuits, wherein a functional circuit of the plurality of functional circuits is configured to initiate a transaction;
   a shared resource configured to output first response data based on an execution of the transaction; and
   an access control system that is coupled with the shared resource and the plurality of functional circuits, and configured to control access to the shared resource for the plurality of functional circuits, wherein the access control system comprises:
      a comparison circuit configured to receive, based on the transaction initiated by the functional circuit, first identification data associated with the functional circuit, and compare the first identification data with a set of reference data to generate a select signal;
      a processing circuit that is coupled with the shared resource, and configured to receive error data and the first response data, and generate second response data; and
      a selection circuit that is coupled with the shared resource, the processing circuit, and the comparison circuit, and configured to select and output, based on the select signal, one of the first and second response data as third response data, wherein the third response data is provided to the functional circuit as a response to the transaction.

8. The SoC of claim 7, wherein the functional circuit is further configured to generate a request based on the initiation of the transaction, and wherein the request includes an address associated with the first response data and second identification data associated with the functional circuit.

9. The SoC of claim 8, further comprising a controller that is coupled with the functional circuit, the shared resource, and the selection circuit, wherein the controller is configured to:
   receive the request from the functional circuit;
   provide the request to the shared resource, wherein the shared resource outputs the first response data based on the request; and
   receive, in response to the request from the selection circuit, the third response data to provide to the functional circuit as the response to the transaction.

10. The SoC of claim 9, wherein the controller is further coupled with the comparison circuit, and configured to generate the first identification data based on the second identification data such that the first identification data is a delayed version of the second identification data, and provide the first identification data to the comparison circuit.

11. The SoC of claim 9, wherein the access control system further comprises a delay circuit that is coupled with the controller and the comparison circuit, and wherein the delay circuit is configured to:
  receive the second identification data from the controller;
  generate the first identification data based on the second identification data such that the first identification data is a delayed version of the second identification data; and
  provide the first identification data to the comparison circuit.

12. The SoC of claim 7, wherein the select signal is activated when the first identification data matches one reference data of the set of reference data, and deactivated when the first identification data does not match the set of reference data.

13. The SoC of claim 12, wherein the selection circuit selects and outputs the first response data as the third response data when the select signal is activated, and when the select signal is deactivated, the selection circuit selects and outputs the second response data as the third response data.

14. The SoC of claim 7, further comprising a core circuit that is coupled with the comparison circuit, and configured to generate and provide the set of reference data to the comparison circuit, wherein the set of reference data is indicative of a set of functional circuits of the plurality of functional circuits for which an error injection operation is to be masked.

15. The SoC of claim 7, wherein to generate the second response data, the processing circuit is further configured to inject one or more errors associated with the error data into the first response data.

16. The SoC of claim 7, wherein the access control system further comprises an error injection circuit that is coupled with the processing circuit, and configured to generate and provide the error data to the processing circuit.

17. A method for controlling access to a shared resource for a plurality of functional circuits by an access control system, the method comprising:
  receiving, by a comparison circuit of the access control system based on a transaction initiated by a functional circuit of the plurality of functional circuits, first identification data associated with the functional circuit;
  comparing, by the comparison circuit, the first identification data with a set of reference data to generate a select signal;
  receiving, by a processing circuit of the access control system, error data and first response data that is outputted by the shared resource based on an execution of the transaction;
  generating, by the processing circuit, second response data based on the first response data and the error data; and
  selecting and outputting, by a selection circuit of the access control system based on the select signal, one of the first and second response data as third response data, wherein the third response data is provided to the functional circuit as a response to the transaction.

18. The method of claim 17, further comprising:
  receiving, by a delay circuit of the access control system when the transaction is initiated, second identification data associated with the functional circuit; and
  generating, by the delay circuit, the first identification data such that the first identification data is a delayed version of the second identification data.

19. The method of claim 17, wherein the select signal is activated when the first identification data matches one reference data of the set of reference data, and deactivated when the first identification data does not match the set of reference data.

20. The method of claim 19, wherein the first response data is selected and outputted as the third response data when the select signal is activated, and when the select signal is deactivated, the second response data is selected and outputted as the third response data.

* * * * *